United States Patent
Sun et al.

(10) Patent No.: US 10,295,371 B2
(45) Date of Patent: May 21, 2019

(54) ELECTRONIC DEVICE AND MAGNETIC SENSOR INTEGRATED CIRCUIT

(71) Applicant: JOHNSON ELECTRIC INTERNATIONAL AG, Murten (CH)

(72) Inventors: Chi Ping Sun, Hong Kong (CN); Fei Xin, Shen Zhen (CN); Ken Wong, Hong Kong (CN); Shing Hin Yeung, Hong Kong (CN); Shu Juan Huang, Shen Zhen (CN); Yun Long Jiang, Shen Zhen (CN); Yue Li, Hong Kong (CN); Bao Ting Liu, Shen Zhen (CN); En Hui Wang, Shen Zhen (CN); Xiu Wen Yang, Shen Zhen (CN); Li Sheng Liu, Shen Zhen (CN); Yan Yun Cui, Shen Zhen (CN)

(73) Assignee: JOHNSON ELECTRIC INTERNATIONAL AG, Murten (CH)

(*) Notice: Subject to any disclaimer, the term of this patent is extended or adjusted under 35 U.S.C. 154(b) by 0 days.

(21) Appl. No.: 15/231,221

(22) Filed: Aug. 8, 2016

(65) Prior Publication Data
US 2016/0341571 A1    Nov. 24, 2016

Related U.S. Application Data

(63) Continuation-in-part of application No. 14/822,353, filed on Aug. 10, 2015, now Pat. No. 9,755,555, and (Continued)

(30) Foreign Application Priority Data

Aug. 8, 2014   (CN) .......................... 2014 1 0390592
Aug. 15, 2014  (CN) .......................... 2014 1 0404474
Jul. 6, 2016   (CN) .......................... 2016 1 0529496

(51) Int. Cl.
H02K 21/24    (2006.01)
H02P 29/032   (2016.01)
(Continued)

(52) U.S. Cl.
CPC ............. G01D 5/142 (2013.01); H01L 27/22 (2013.01); H01L 43/06 (2013.01); H02K 11/215 (2016.01);
(Continued)

(58) Field of Classification Search
CPC .......... H02P 6/16; H02P 29/032; H02K 21/24
See application file for complete search history.

(56) References Cited

U.S. PATENT DOCUMENTS 5,446,359 A * 8/1995 Horst .................. H02P 25/0925
                                              318/400.38
5,675,226 A   10/1997 Riola'
(Continued)

FOREIGN PATENT DOCUMENTS

CN    201408014 Y  *  2/2010
CN    201409107 Y     2/2010
(Continued)

*Primary Examiner* — Eduardo Colon Santana
*Assistant Examiner* — Cortez M Cook
(74) *Attorney, Agent, or Firm* — Muncy, Geissler, Olds & Lowe, P.C.

(57) ABSTRACT

An electronic device and a magnetic sensor integrated circuit thereof are provided. The magnetic sensor integrated circuit includes a shell, a semiconductor substrate installed in the shell and a first to a third port extending from the shell. A rectifier and a position sensor are provided on the semiconductor substrate. The rectifier includes first and second output terminals and two input terminals respectively connected to the first and second ports. In a case that the first and second ports are positively or negatively connected to an external power supply, a voltage output by the first output (Continued)

terminal of the rectifier is higher than the voltage output by the second output terminal of the rectifier. The position sensor is connected to the first and second output terminals of the rectifier, and a magnetic field signal detected by the position sensor is output by the third port.

10 Claims, 10 Drawing Sheets

Related U.S. Application Data a continuation-in-part of application No. PCT/CN2015/086422, filed on Aug. 7, 2015.

(51) Int. Cl.
| | | |
|---|---|---|
| *H02P 6/16* | (2016.01) | |
| *G01D 5/14* | (2006.01) | |
| *H01L 27/22* | (2006.01) | |
| *H01L 43/06* | (2006.01) | |
| *H02P 6/20* | (2016.01) | |
| *H02K 11/215* | (2016.01) | |
| *H02P 7/295* | (2016.01) | |
| *H02P 6/30* | (2016.01) | |
| *H02P 7/03* | (2016.01) | |

(52) U.S. Cl.
CPC .............. *H02P 6/20* (2013.01); *H02P 6/30* (2016.02); *H02P 7/05* (2016.02); *H02P 7/295* (2013.01); *H02P 2207/05* (2013.01)

(56) References Cited

U.S. PATENT DOCUMENTS

| | | | | |
|---|---|---|---|---|
| 6,392,370 | B1* | 5/2002 | Bedini | H02K 21/24 |
| | | | | 310/113 |
| 7,173,388 | B1* | 2/2007 | Hsu | H02P 29/032 |
| | | | | 318/400.21 |
| 2005/0122100 | A1* | 6/2005 | Wan | G01R 33/0206 |
| | | | | 324/247 |
| 2007/0103103 | A1* | 5/2007 | Maue | H02P 6/16 |
| | | | | 318/280 |

FOREIGN PATENT DOCUMENTS

| | | |
|---|---|---|
| CN | 201590796 U | 9/2010 |
| CN | 102075130 A | 5/2011 |
| DE | 102006055482 A1 | 6/2008 |

* cited by examiner

ELECTRONIC DEVICE AND MAGNETIC SENSOR INTEGRATED CIRCUIT

CROSS REFERENCE TO RELATED APPLICATIONS

This non-provisional patent application is a continuation-in-part of U.S. patent application Ser. No. 14/822,353, which claims priority to Chinese Patent Application No. 201410390592.2, filed on Aug. 8, 2014 and to Chinese Patent Application No. 201410404474.2, filed on Aug. 15, 2014. In addition, this non-provisional patent application claims priority under the Paris Convention to PCT Patent Application No. PCT/CN2015/086422, filed with the Chinese Patent Office on Aug. 7, 2015, and to Chinese Patent Application No. CN201610529496.0, filed with the Chinese Patent Office on Jul. 6, 2016, both of which are incorporated herein by reference in their entirety.

TECHNICAL FIELD

The present disclosure relates to the technical field of position sensor.

BACKGROUND

During starting of a synchronous motor, the stator produces an alternating magnetic field causing the permanent magnetic rotor to be oscillated. The amplitude of the oscillation of the rotor increases until the rotor begins to rotate, and finally the rotor is accelerated to rotate in synchronism with the alternating magnetic field of the stator. To ensure the starting of a conventional synchronous motor, a starting point of the motor is set to be low, which results in that the motor cannot operate at a relatively high working point, thus the efficiency is low. In another aspect, the rotor cannot be ensured to rotate in a same direction every time since a stop or stationary position of the permanent magnetic rotor is not fixed. Accordingly, in applications such as a fan and water pump, the impeller driven by the rotor has straight radial vanes, which results in a low operational efficiency of the fan and water pump.

FIG. 1 illustrates a conventional drive circuit for a synchronous motor, which allows a rotor to rotate in a same predetermined direction in every time it starts. In the circuit, a stator winding 1 of the motor is connected in series with a TRIAC between two terminals M and N of an AC power source VM, and an AC power source VM is converted by a conversion circuit DC into a direct current voltage and the direct current is supplied to a position sensor H. A magnetic pole position of a rotor in the motor is detected by the position sensor H, and an output signal Vh of the position sensor H is connected to a switch control circuit PC to control the bidirectional thyristor T.

FIG. 2 illustrates a waveform of the drive circuit. It can be seen from FIG. 2 that, in the drive circuit, no matter the bidirectional thyristor T is switched on or off, the AC power source supplies power for the conversion circuit DC so that the conversion circuit DC constantly outputs and supplies power for the position sensor H (referring to a signal VH in FIG. 2). In a low-power application, in a case that the AC power source is commercial electricity of about 200V, the electric energy consumed by two resistors R2 and R3 in the conversion circuit DC is more than the electric energy consumed by the motor.

The magnetic sensor applies Hall effect, in which, when current I runs through a substance and a magnetic field B is applied in a positive angle with respect to the current I, a potential difference V is generated in a direction perpendicular to the direction of current I and the direction of the magnetic field B. The magnetic sensor is often implemented to detect the magnetic polarity of an electric rotor.

The magnetic sensor conventionally has a power supply terminal connected to an anode of an external direct current power supply and a ground terminal connected to a cathode of the direct current power supply. If the position sensor is installed reversely due to carelessness of operating personnel when the device is manufactured, the power supply terminal of the position sensor is connected to the cathode of the power supply and the ground terminal of the position sensor is connected to the anode of the power supply, the position sensor will burn out, or even the whole device will be damaged.

SUMMARY

A magnetic sensor integrated circuit is provided according to embodiments of the disclosure. The magnetic sensor integrated circuit includes a shell, a semiconductor substrate installed in the shell, and a first to a third port extending from the shell. The semiconductor substrate is provided with:

a rectifier comprising a first output terminal, a second output terminal and two input terminals respectively connected to the first port and the second port, wherein in a case that the first port and the second port are positively or negatively connected to an external power supply, a voltage output by the first output terminal of the rectifier is higher than the voltage output by the second output terminal of the rectifier; and a position sensor configured to detect a magnetic field, wherein the position sensor is connected to the first output terminal and the second output terminal of the rectifier, and a magnetic field signal detected by the position sensor is output via the third port.

As a preferred solution, the position sensor includes a power supply terminal, a ground terminal and an output terminal. The power supply terminal is connected to the first output terminal of the rectifier; the ground terminal is connected to the second output terminal of the rectifier; and the output terminal of the position sensor is connected to the third port.

As a preferred solution, the semiconductor substrate is further provided with an output control circuit comprising a first to a third terminal, the first terminal is connected to the first output terminal of the rectifier, the second terminal is connected to the output terminal of the position sensor, the third terminal is connected to the third port, and a signal output by the third terminal of the output control circuit is determined based on a magnetic field signal output by the output terminal of the position sensor.

As a preferred solution, in a case that the magnetic field signal output by the output terminal of the position sensor is a logic high, the third terminal of the output control circuit outputs a logic high; and in a case that the magnetic field signal output by the output terminal of the position sensor is a logic low, the third terminal of the output control circuit outputs a logic low.

As a preferred solution, the output control circuit includes a first resistor, a NPN triode, a second resistor and a diode, the second resistor and the diode are connected in series between the output terminal of the position sensor and the third port, a cathode of the diode is connected to the output terminal of the position sensor, one end of the first resistor is connected to the first output terminal of the rectifier, and the other end is connected to the output terminal of the position sensor, a base of the NPN triode is connected to the output terminal of the position sensor, an emitter of the NPN triode is connected to an anode of the diode, and a collector of the NPN triode is connected to the first output terminal of the rectifier.

As a preferred solution, the magnetic sensor integrated circuit comprises a single one bare die, or more than one bare die.

As a preferred solution, the third port is located between the first port and the second port.

As a preferred solution, a distance between the third port and the first port is the same as a distance between the third port and the second port.

As a preferred solution, the position sensor is a Hall sensor.

As a preferred solution, a voltage stabilizer is provided between the first output terminal and the second output terminal of the rectifier.

An electronic device is provided according to an embodiment of the disclosure, which includes:
  a direct current power supply;
  a rectifier powered by the direct current power supply and comprising a first output terminal and a second output terminal, a voltage output by the first output terminal of the rectifier being higher than a voltage output by the second output terminal of the rectifier; and a position sensor configured to detect a magnetic field and coupled to the first output terminal and the second output terminal of the rectifier.

As a preferred solution, the rectifier and the position sensor are integrated into one integrated circuit.

As a preferred solution, the integrated circuit includes a first to a third port, the rectifier comprises a first to a fourth diode, a cathode of the first diode is connected to an anode of the second diode and the first port, a cathode of the second diode is connected to a cathode of the third diode, an anode of the third diode is connected to a cathode of the fourth diode and the second port, an anode of the fourth diode is connected to an anode of the first diode, the cathode of the second diode serves as the first output terminal of the rectifier and is coupled to the position sensor, the anode of the fourth diode serves as the second output terminal of the rectifier and is coupled to the position sensor, and the magnetic field signal detected by the position sensor is output by the third port.

As a preferred solution, the rectifier includes a first and a second input terminal which are connected to the direct current power supply, a first and a second zener diode, and a first and a second resistor, an anode of the first zener diode is connected to a cathode of the second zener diode and the second input terminal, an anode of the second zener diode is connected to the first input terminal via the first resistor, a cathode of the first zener diode is connected to the first input terminal via the second resistor, the cathode of the first zener diode is connected to the first output terminal, and the anode of the second zener diode is connected to the second output terminal.

As a preferred solution, the first zener diode, the second zener diode and the position sensor are integrated into one integrated circuit, and the first resistor and the second resistor are provided outside the integrated circuit, the integrated circuit comprises a first to a fourth port, the cathode of the first zener diode is connected to the first port, the anode of the first zener diode is connected to the third port, the anode of the second zener diode is connected to the second port, and the magnetic field signal detected by the position sensor is output by the fourth port.

As a preferred solution, the electronic device further includes a printed circuit board. A power supply pad, a ground pad and a signal pad are provided on the printed circuit board. The first port of the magnetic sensor integrated circuit is connected to the power supply pad, the second port is connected to the ground pad, and the third port is connected to the signal pad; or the first port of the magnetic sensor integrated circuit is connected to the ground pad, the second port is connected to the power supply pad, and the third port is connected to the signal pad.

As a preferred solution, the signal pad is located between the power supply pad and the ground pad.

As a preferred solution, a distance between the signal pad and the power supply pad is the same as a distance between the signal pad and the ground pad.

According to the embodiments of the disclosure, in addition to the position sensor, the rectifier is also integrated into the magnetic sensor integrated circuit. The rectifier is configured to work well no matter the magnetic sensor integrated circuit is connected to the external power supply positively or negatively. The production efficiency can be improved by means of the magnetic sensor integrated circuit according to the embodiments of the disclosure in manufacturing the electronic device.

BRIEF DESCRIPTION OF THE DRAWINGS

The drawings to be used in the description of embodiments of the disclosure or the conventional technology are described briefly as follows, so that technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION OF THE EMBODIMENTS

Figure 1:
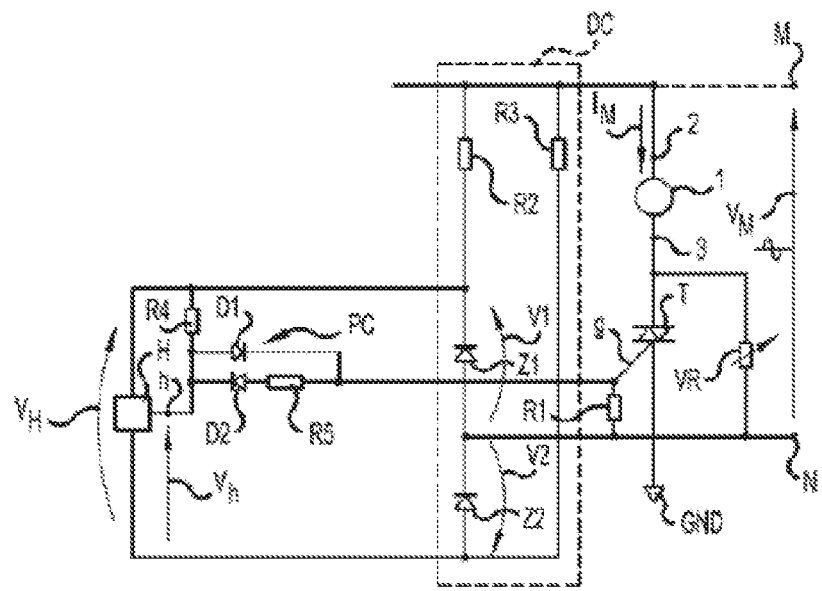
FIG. 1 illustrates a prior art drive circuit for a synchronous motor, according to an embodiment of the present disclosure.
Figure 2:
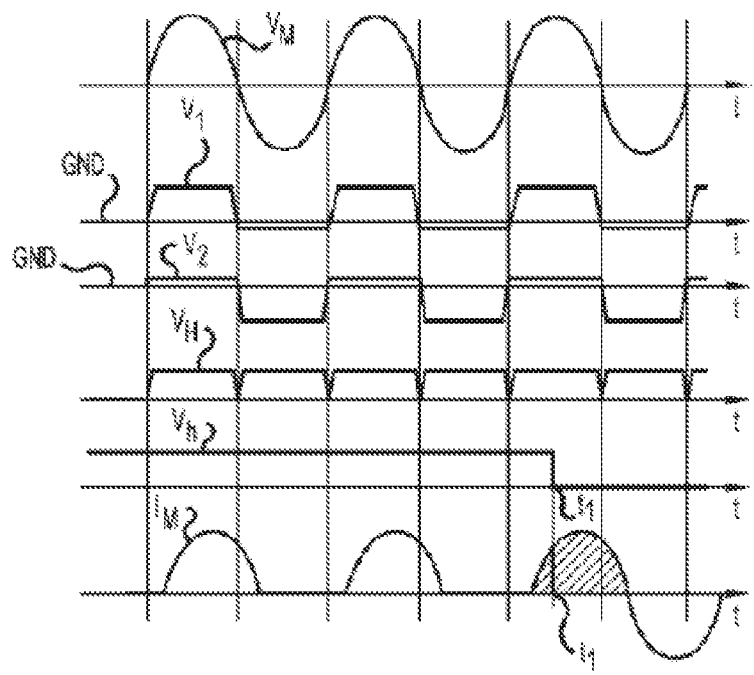
FIG. 2 illustrates a waveform of the drive circuit shown in FIG. 1.

Hereinafter, specific embodiments of the disclosure will be described in detail in conjunction with drawings, so as to make the technical solutions of the disclosure and other beneficial results clear. As may be understood, the drawings only provide references and illustrations, and do not restrict the disclosure. The sizes shown in the drawings are only for clear description, and do not restrict a proportion relationship.

Figure 3:
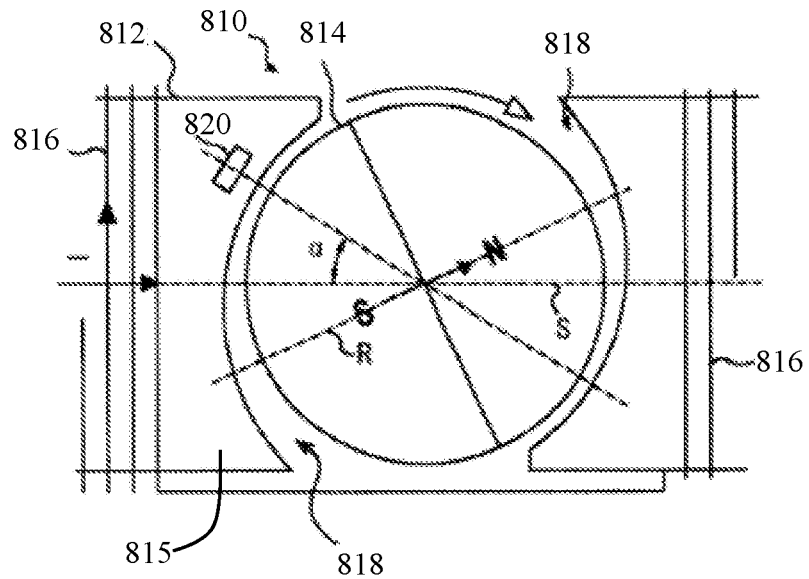
FIG. 3 illustrates a diagrammatic representation of a synchronous motor, according to an embodiment of the present disclosure.

FIG. 3 schematically shows a synchronous motor according to an embodiment of the present invention. The synchronous motor 810 includes a stator 812 and a permanent magnet rotor 814 rotatably disposed between magnetic poles of the stator 812, and the stator 812 includes a stator core 815 and a stator winding 816 wound on the stator core 815. The rotor 814 includes at least one permanent magnet forming at least one pair of permanent magnetic poles with opposite polarities, and the rotor 814 operates at a constant rotational speed of 60 f/p rpm during a steady state phase in a case that the stator winding 816 is connected to an AC power supply, where f is a frequency of the AC power supply and p is the number of pole pairs of the rotor.

Non-uniform gap 818 is formed between the magnetic poles of the stator 812 and the permanent magnetic poles of the rotor 814 so that a polar axis R of the rotor 814 has an angular offset a relative to a central axis S of the stator 812 in a case that the rotor is at rest. The rotor 814 may be configured to have a fixed starting direction (a clockwise direction in this embodiment as shown by the arrow in FIG. 3) every time the stator winding 816 is energized. The stator and the rotor each have two magnetic poles as shown in FIG. 3. It can be understood that, in other embodiments, the stator and the rotor may also have more magnetic poles, such as 4 or 6 magnetic poles.

A position sensor 820 for detecting the angular position of the rotor is disposed on the stator 812 or at a position near the rotor inside the stator, and the position sensor 820 has an angular offset relative to the central axis S of the stator. Preferably, this angular offset is also a, as in this embodiment. Preferably, the position sensor 820 is a Hall effect sensor.

Figure 4:
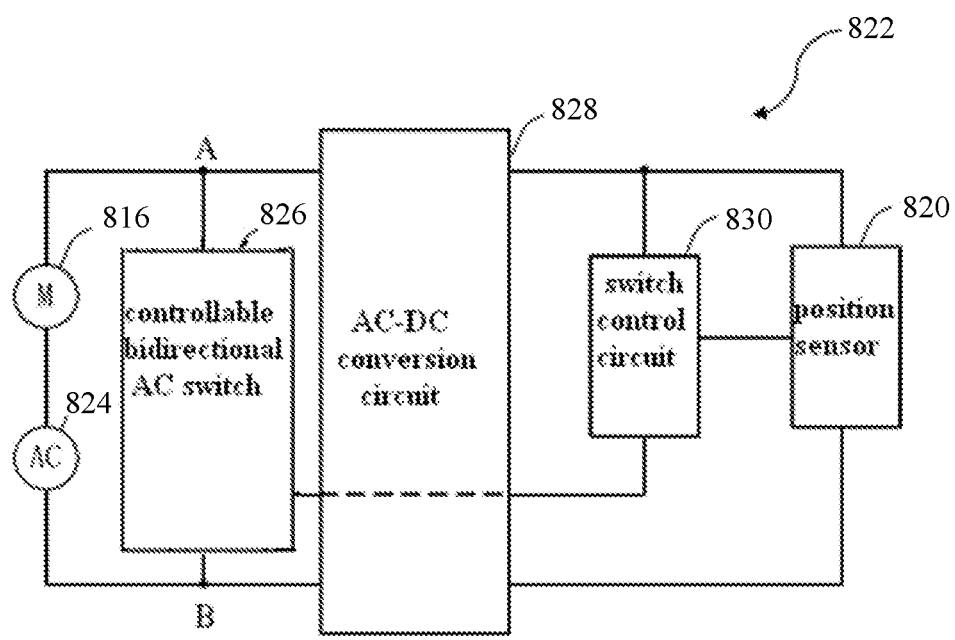
FIG. 4 illustrates a block diagram of a drive circuit for a synchronous motor, according to an embodiment of the present disclosure.

FIG. 4 shows a block diagram of a drive circuit for a synchronous motor according to an embodiment of the present invention. In the drive circuit 822, the stator winding 816 and the AC power supply 824 are connected in series between two nodes A and B. Preferably, the AC power supply 824 may be a commercial AC power supply with a fixed frequency, such as 50 Hz or 60 Hz, and a supply voltage may be, for example, 110V, 220V or 230V. A controllable bidirectional AC switch 826 is connected between the two nodes A and B, in parallel with the stator winding 816 and the AC power supply 824. Preferably, the controllable bidirectional AC switch 826 is a TRIAC, of which two anodes are connected to the two nodes A and B respectively. It can be understood that, the controllable bidirectional AC switch 826 alternatively may be two silicon control rectifiers reversely connected in parallel, and control circuits may be correspondingly configured to control the two silicon control rectifiers in a preset way. An AC-DC conversion circuit 828 is also connected between the two nodes A and B. An AC voltage between the two nodes A and B is converted by the AC-DC conversion circuit 828 into a low voltage DC. The position sensor 820 may be powered by the low voltage DC output by the AC-DC conversion circuit 828, for detecting the magnetic pole position of the permanent magnet rotor 814 of the synchronous motor 810 and outputting a corresponding signal. A switch control circuit 830 is connected to the AC-DC conversion circuit 828, the position sensor 820 and the controllable bidirectional AC switch 826, and is configured to control the controllable bidirectional AC switch 826 to be switched between a switch-on state and a switch-off state in a predetermined way, based on the magnetic pole position of the permanent magnet rotor which is detected by the position sensor and polarity information of the AC power supply 824 which may be obtained from the AC-DC conversion circuit 828, such that the stator winding 816 urges the rotor 814 to rotate only in the above-mentioned fixed starting direction during a starting phase of the motor. According to this embodiment of the present invention, in a case that the controllable bidirectional AC switch 826 is switched on, the two nodes A and B are shorted, the AC-DC conversion circuit 828 does not consume electric energy since there is no current flowing through the AC-DC conversion circuit 828, hence, the utilization efficiency of electric energy can be improved significantly.

Figure 5:
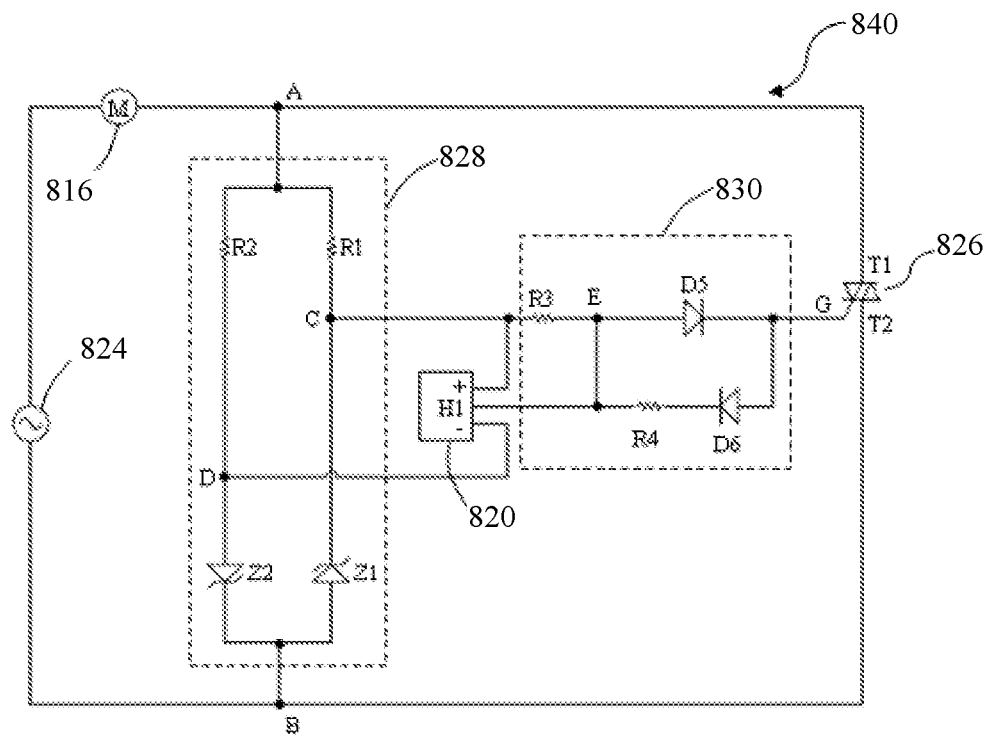
FIG. 5 illustrates a drive circuit for a synchronous motor, according to an embodiment of the present disclosure.

FIG. 5 shows a circuit diagram of a drive circuit 840 for a synchronous motor according to a first embodiment of the present disclosure. The stator winding 816 of the synchronous motor is connected in series with the AC power supply 824 between the two nodes A and B. A first anode T1 of the TRIAC 826 is connected to the node A, and a second anode T2 of the TRIAC 826 is connected to the node B. The AC-DC conversion circuit 828 is connected in parallel with the TRIAC 826 between the two nodes A and B. An AC voltage between the two nodes A and B is converted by the AC-DC conversion circuit 828 into a low voltage DC (preferably, low voltage ranges from 3V to 18V). The AC-DC conversion circuit 828 includes a first zener diode Z1 and a second zener diode Z2 which are reversely connected in parallel between the two nodes A and B via a first resistor R1 and a second resistor R2 respectively. A high voltage output terminal C of the AC-DC conversion circuit 828 is formed at a connection point of the first resistor R1 and a cathode of the first zener diode Z1, and a low voltage output terminal D of the AC-DC conversion circuit 828 is formed at a connection point of the second resistor R2 and an anode of the second zener diode Z2. The voltage output terminal C is connected to a positive power supply terminal of the position sensor 820, and the voltage output terminal D is connected to a negative power supply terminal of the position sensor 820. Three terminals of the switch control circuit 830 are connected to the high voltage output terminal C of the AC-DC conversion circuit 828, an output terminal H1 of the position sensor 820 and a control electrode G of the TRIAC 826 respectively. The switch control circuit 830 includes a third resistor R3, a fifth diode D5, and a fourth resistor R4 and a sixth diode D6 connected in series between the output terminal H1 of the position sensor 820 and the control electrode G of the controllable bidirectional AC switch 826. An anode of the sixth diode D6 is connected to the control electrode G of the controllable bidirectional AC switch 826. One terminal of the third resistor R3 is connected to the high voltage output terminal C of the AC-DC conversion circuit 828, and the other terminal of the third resistor R3 is connected to an anode of the fifth diode D5. A cathode of the fifth diode D5 is connected to the control electrode G of the controllable bidirectional AC switch 826.

Figure 6:
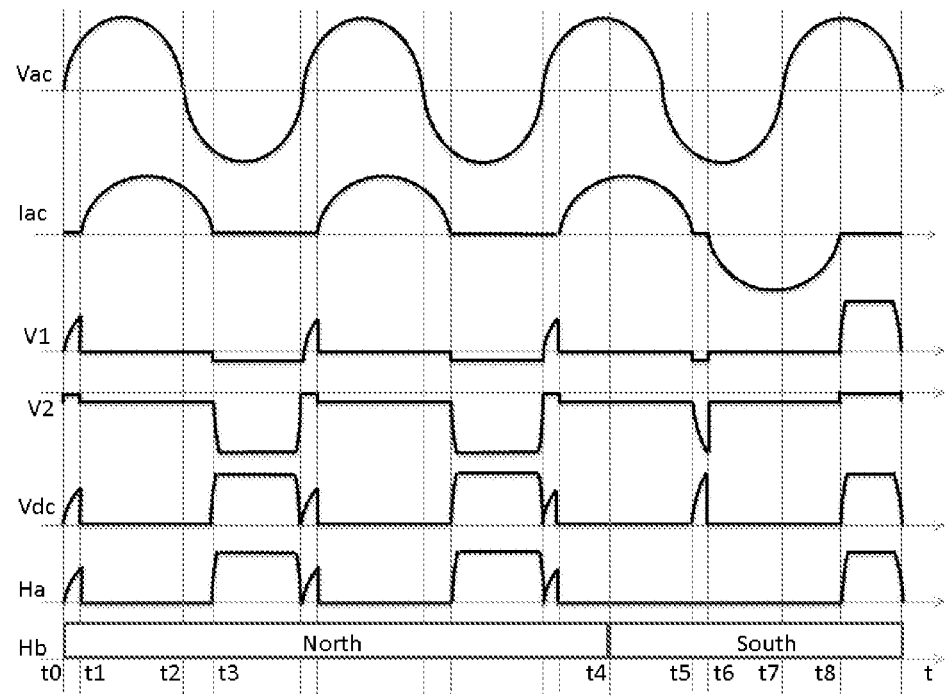
FIG. 6 illustrates a waveform of the drive circuit shown in FIG. 5.

In conjunction with FIG. 6, an operational principle of the drive circuit 840 is described. In FIG. 6, Vac indicates a waveform of voltage of the AC power supply 824, and Iac indicates a waveform of current flowing through the stator winding 816. Due to the inductive character of the stator winding 816, the waveform of current Iac lags behind the waveform of voltage Vac. V1 indicates a waveform of voltage between two terminals of the first zener diode Z1, V2 indicates a waveform of voltage between two terminals of the second zener diode Z2, Vdc indicates a waveform of voltage between two output terminals C and D of the AC-DC conversion circuit 828, Ha indicates a waveform of a signal output by the output terminal H1 of the position sensor 820, and Hb indicates a rotor magnetic field detected by the position sensor 820. In this embodiment, in a case that the position sensor 820 is powered normally, the output terminal HI outputs a logic high level in a case that the detected rotor magnetic field is North, or the output terminal H1 outputs a logic low level in a case that the detected rotor magnetic field is South.

In a case that the rotor magnetic field Hb detected by the position sensor 820 is North, in a first positive half cycle of the AC power supply, the supply voltage is gradually increased from a time instant t0 to a time instant t1, the output terminal H1 of the position sensor 820 outputs a high level, and a current flows through the resistor R1, the resistor R3, the diode D5 and the control electrode G and the second anode T2 of the TRIAC 826 sequentially. The TRIAC 826 is switched on in a case that a drive current flowing through the control electrode G and the second anode T2 is greater than a gate triggering current Ig. Once the TRIAC 826 is switched on, the two nodes A and B are shorted, a current flowing through the stator winding 816 in the motor is gradually increased until a large forward current flows through the stator winding 816 to drive the rotor 814 to rotate clockwise as shown in FIG. 3. Since the two nodes A and B are shorted, there is no current flowing through the AC-DC conversion circuit 28 from the time instant t1 to a time instant t2. Hence, the resistors R1 and R2 do not consume electric energy, and the output of the position sensor 820 is stopped due to no power is supplied. Since the current flowing through two anodes T1 and T2 of the TRIAC 826 is large enough (which is greater than a holding current Ihold), the TRIAC 826 is kept to be switched on in a case that there is no drive current flowing through the control electrode G and the second anode T2. In a negative half cycle of the AC power supply, after a time instant t3, a current flowing through T1 and T2 is less than the holding current Ihold, the TRIAC 826 is switched off, a current begins to flow through the AC-DC conversion circuit 828, and the output terminal HI of the position sensor 820 outputs a high level again. Since a potential at the point C is lower than a potential at the point E, there is no drive current flowing through the control electrode G and the second anode T2 of the TRIAC 826, and the TRIAC 826 is kept to be switched off. Since the resistance of the resistors R1 and R2 in the AC-DC conversion circuit 828 are far greater than the resistance of the stator winding 816 in the motor, a current currently flowing through the stator winding 816 is far less than the current flowing through the stator winding 816 from the time instant t1 to the time instant t2 and generates very small driving force for the rotor 814. Hence, the rotor 814 continues to rotate clockwise due to inertia. In a second positive half cycle of the AC power supply, similar to the first positive half cycle, a current flows through the resistor R1, the resistor R3, the diode D5, and the control electrode G and the second anode T2 of the TRIAC 826 sequentially. The TRIAC 826 is switched on again, and the current flowing through the stator winding 816 continues to drive the rotor 814 to rotate clockwise. Similarly, the resistors R1 and R2 do not consume electric energy since the two nodes A and B are shorted. In the next negative half cycle of the power supply, the current flowing through the two anodes T1 and T2 of the TRIAC 826 is less than the holding current Ihold, the TRIAC 826 is switched off again, and the rotor continues to rotate clockwise due to the effect of inertia.

At a time instant t4, the rotor magnetic field Hb detected by the position sensor 820 changes to be South from North, the AC power supply is still in the positive half cycle and the TRIAC 826 is switched on, the two nodes A and B are shorted, and there is no current flowing through the AC-DC conversion circuit 828. After the AC power supply enters the negative half cycle, the current flowing through the two anodes T1 and T2 of the TRIAC 826 is gradually decreased, and the TRIAC 826 is switched off at a time instant t5. Then the current flows through the second anode T2 and the control electrode G of the TRIAC 826, the diode D6, the resistor R4, the position sensor 820, the resistor R2 and the stator winding 816 sequentially. As the drive current is gradually increased, the TRIAC 826 is switched on again at a time instant t6, the two nodes A and B are shorted again, the resistors R1 and R2 do not consume electric energy, and the output of the position sensor 820 is stopped due to no power is supplied. There is a larger reverse current flowing through the stator winding 816, and the rotor 814 continues to be driven clockwise since the rotor magnetic field is South. From the time instant t5 to the time instant t6, the first zener diode Z1 and the second zener diode Z2 are switched on, hence, there is a voltage output between the two output terminals C and D of the AC-DC conversion circuit 828. At a time instant t7, the AC power supply enters the positive half cycle again, the TRIAC 826 is switched off when the current flowing through the TRIAC 826 crosses zero, and then a voltage of the control circuit is gradually increased. As the voltage is gradually increased, a current begins to flow through the AC-DC conversion circuit 828, the output terminal H1 of the position sensor 820 outputs a low level, there is no drive current flowing through the control electrode G and the second anode T2 of the TRIAC 826, hence, the TRIAC 826 is switched off. Since the current flowing through the stator winding 816 is very small, nearly no driving force is generated for the rotor 814. At a time instant t8, the power supply is in the positive half cycle, the position sensor outputs a low level, the TRIAC 826 is kept to be switched off after the current crosses zero, and the rotor continues to rotate clockwise due to inertia. According to an embodiment of the present invention, the rotor may be accelerated to be synchronized with the stator after rotating only one circle after the stator winding is energized.

In the embodiment of the present invention, by taking advantage of a feature of a TRIAC that the TRIAC is kept to be switched on although there is no drive current flowing though the TRIAC once the TRIAC is switched on, it is avoided that a resistor in the AC-DC conversion circuit still consumes electric energy after the TRIAC is switched on, hence, the utilization efficiency of electric energy can be improved significantly.

Figure 7:
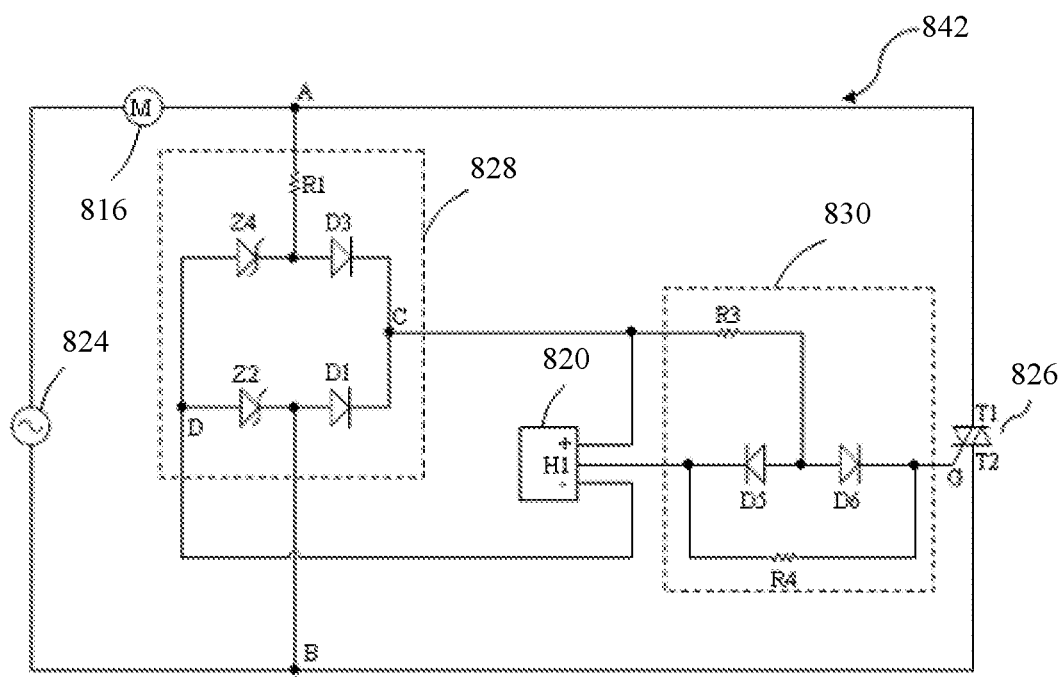
FIGS. 7 to 10 illustrate different embodiments of a drive circuit of a synchronous motor, according to an embodiment of the present disclosure.

FIG. 7 shows a circuit diagram of a drive circuit 842 for a synchronous motor according to an embodiment of the present disclosure. The stator winding 816 of the synchronous motor is connected in series with the AC power supply 824 between the two nodes A and B. A first anode T1 of the TRIAC 826 is connected to the node A, and a second anode T2 of the TRIAC 826 is connected to the node B. The AC-DC conversion circuit 828 is connected in parallel with the TRIAC 826 between the two nodes A and B. An AC between the two nodes A and B is converted by the AC-DC conversion circuit 828 into a low voltage DC, preferably, a low voltage ranging from 3V to 18V. The AC-DC conversion circuit 828 includes a first resistor R1 and a full wave bridge rectifier connected in series between the two nodes A and B. The full wave bridge rectifier includes two rectifier branches connected in parallel, one of the two rectifier branches includes a first diode D1 and a third diode D3 reversely connected in series, and the other of the two rectifier branches includes a second zener diode Z2 and a fourth zener diode Z4 reversely connected in series, the high voltage output terminal C of the AC-DC conversion circuit 828 is formed at a connection point of a cathode of the first diode D1 and a cathode of the third diode D3, and the low voltage output terminal D of the AC-DC conversion circuit 828 is formed at a connection point of an anode of the second zener diode Z2 and an anode of the fourth zener diode Z4. The output terminal C is connected to a positive power supply terminal of the position sensor 820, and the output terminal D is connected to a negative power supply terminal of the position sensor 820. The switch control circuit 30 includes a third resistor R3, a fourth resistor R4, and a fifth diode D5 and a sixth diode D6 reversely connected in series between the output terminal H1 of the position sensor 820 and the control electrode G of the controllable bidirectional AC switch 826. A cathode of the fifth diode D5 is connected to the output terminal H1 of the position sensor, and a cathode of the sixth diode D6 is connected to the control electrode G of the controllable bidirectional AC switch. One terminal of the third resistor R3 is connected to the high voltage output terminal C of the AC-DC conversion circuit, and the other terminal of the third resistor R3 is connected to a connection point of an anode of the fifth diode D5 and an anode of the sixth diode D6. Two terminals of the fourth resistor R4 are connected to a cathode of the fifth diode D5 and a cathode of the sixth diode D6 respectively.

Figure 8:
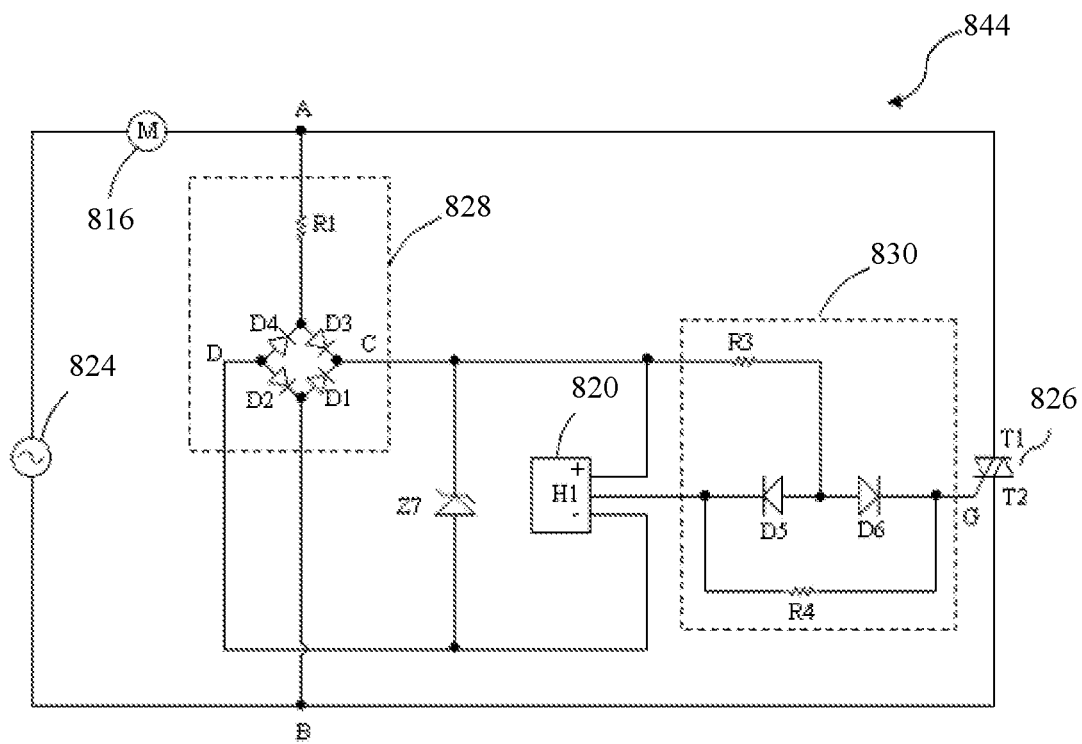

FIG. 8 shows a circuit diagram of a drive circuit 844 for a synchronous motor according to a further embodiment of the present invention. The drive circuit 844 is similar to the drive circuit 842 in the previous embodiment, and the drive circuit 844 differs from the drive circuit 842 in that, the zener diodes Z2 and Z4 in the drive circuit 842 are replaced by general diodes D2 and D4 in the rectifier of the drive circuit 844. In addition, a zener diode Z7 is connected between the two output terminals C and D of the AC-DC conversion circuit 828 in the drive circuit 844.

Figure 9:
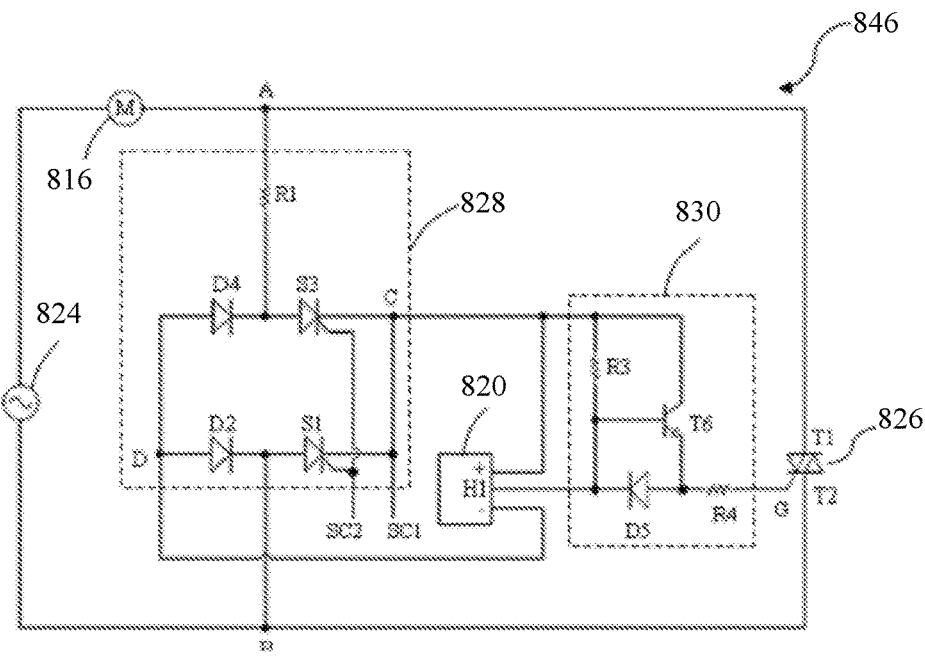

FIG. 9 shows a circuit diagram of a drive circuit 846 for a synchronous motor according to further embodiment of the present invention. The stator winding 816 of the synchronous motor is connected in series with the AC power supply 824 between the two nodes A and B. A first anode Ti of the TRIAC 826 is connected to the node A, and a second anode T2 of the TRIAC 826 is connected to the node B. The AC-DC conversion circuit 828 is connected in parallel with the TRIAC 826 between the two nodes A and B. An AC voltage between the two nodes A and B is converted by the AC-DC conversion circuit 828 into a low voltage DC, preferably, a low voltage ranging from 3V to 18V. The AC-DC conversion circuit 828 includes a first resistor R1 and a full wave bridge rectifier connected in series between the two nodes A and B. The full wave bridge rectifier includes two rectifier branches connected in parallel, one of the two rectifier branches includes two silicon control rectifiers S1 and S3 reversely connected in series, and the other of the two rectifier branches includes a second diode D2 and a fourth diode D4 reversely connected in series. The high voltage output terminal C of the AC-DC conversion circuit 828 is formed at a connection point of a cathode of the silicon control rectifier S1 and a cathode of the silicon control rectifier S3, and the low voltage output terminal D of the AC-DC conversion circuit 828 is formed at a connection point of an anode of the second diode D2 and an anode of the fourth diode D4. The output terminal C is connected to a positive power supply terminal of the position sensor 820, and the output terminal D is connected to a negative power supply terminal of the position sensor 820. The switch control circuit 830 includes a third resistor R3, an NPN transistor T6, and a fourth resistor R4 and a fifth diode D5 connected in series between the output terminal H1 of the position sensor 820 and the control electrode G of the controllable bidirectional AC switch 826. A cathode of the fifth diode D5 is connected to the output terminal H1 of the position sensor. One terminal of the third resistor R3 is connected to the high voltage output terminal C of the AC-DC conversion circuit, and the other terminal of the third resistor R3 is connected to the output terminal H1 of the position sensor. A base of the NPN transistor T6 is connected to the output terminal H1 of the position sensor, an emitter of the NPN transistor T6 is connected to an anode of the fifth diode D5, and a collector of the NPN transistor T6 is connected to the high voltage output terminal C of the AC-DC conversion circuit.

In this embodiment, a reference voltage may be input to the cathodes of the two silicon control rectifiers S1 and S3 via a terminal SC1, and a control signal may be input to control terminals of S1 and S3 via a terminal SC2. The rectifiers Si and S3 are switched on in a case that the control signal input from the terminal SC2 is a high level, or are switched off in a case that the control signal input from the terminal SC2 is a low level. Based on the configuration, the rectifiers S1 and S3 may be switched between a switch-on state and a switch-off state in a preset way by inputting the high level from the terminal SC2 in a case that the drive circuit operates normally. The rectifiers S1 and S3 are switched off by changing the control signal input from the terminal SC2 from the high level to the low level in a case that the drive circuit fails. In this case, the TRIAC 826, the conversion circuit 828 and the position sensor 820 are switched off, to ensure the whole circuit to be in a zero-power state.

Figure 10:
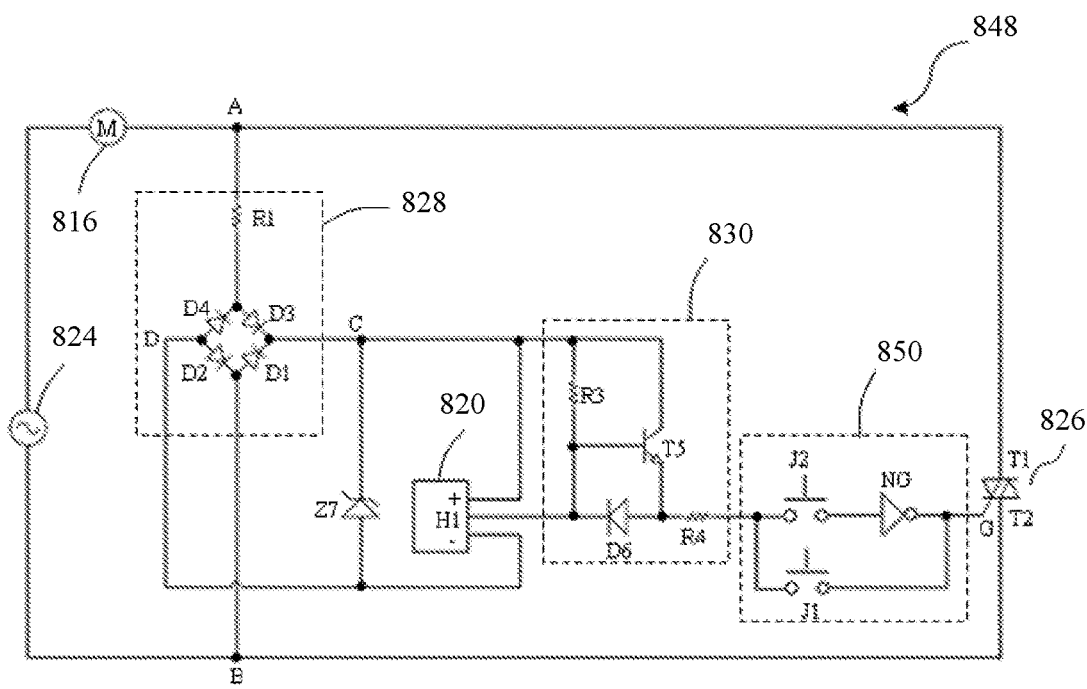

FIG. 10 shows a circuit diagram of a drive circuit 848 for a synchronous motor according to another embodiment of the present invention. The drive circuit 848 is similar to the drive circuit 846 in the previous embodiment and, the drive circuit 848 differs from the drive circuit 846 in that, the silicon control diodes S1 and S3 in the drive circuit 846 are replaced by general diodes D1 and D3 in the rectifier of the drive circuit 848, and a zener diode Z7 is connected between the two terminals C and D of the AC-DC conversion circuit 828. In addition, in the drive circuit 848 according to the embodiment, a preset steering circuit 850 is disposed between the switch control circuit 30 and the TRIAC 826. The preset steering circuit 850 includes a first jumper switch J1, a second jumper J2 switch and an inverter NG connected in series with the second jumper switch J2. Similar to the drive circuit 846, in this embodiment, the switch control circuit 830 includes the resistor R3, the resistor R4, the NPN transistor T5 and the diode D6. One terminal of the resistor R4 is connected to a connection point of an emitter of the transistor T5 and an anode of the diode D6, and the other terminal of the resistor R4 is connected to one terminal of the first jumper switch J1, and the other terminal of the first jumper switch J1 is connected to the control electrode G of the TRIAC 826, and the second jumper switch J2 and the inverter NG connected in series are connected across two terminals of the first jumper switch J1. In this embodiment, when the first jumper switch J1 is switched on and the second jumper switch J2 is switched off, similar to the above embodiments, the rotor 814 still starts clockwise; when the second jumper switch J2 is switched on and the first jumper switch J1 is switched off, the rotor 814 starts counterclockwise. In this case, a starting direction of the rotor in the motor may be selected by selecting one of the two jumper switches to be switched on and the other to be switched off. Therefore, in a case that a driving motor is needed to be supplied for different applications having opposite rotational directions, it is just needed to select one of the two jumper switches J1 and J2 to be switched on and the other to be switched off, and no other changes need to be made to the drive circuit, hence, the drive circuit according to this embodiment has good versatility.

Figure 11:
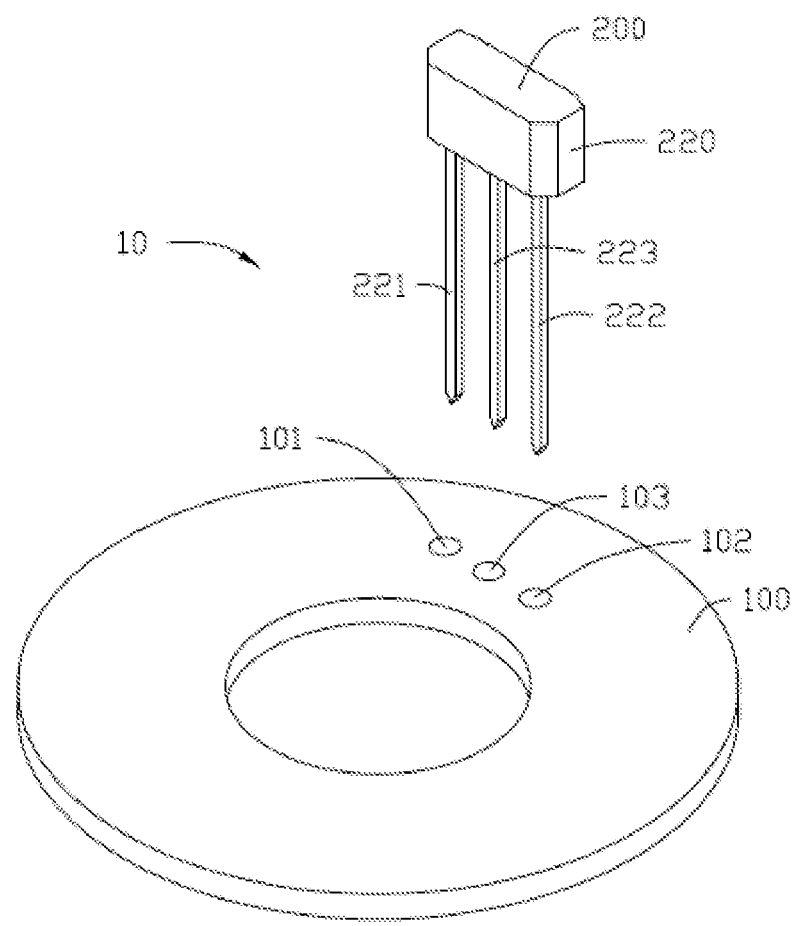
FIG. 11 is a schematic diagram of an electronic device of the disclosure, including a printed circuit board and a magnetic sensor integrated circuit normally installed on the printed circuit board.

FIG. 11 schematically shows an electronic device 10 according to a preferred embodiment of the disclosure. The electronic device 10 can be applied to devices such as an electric vehicle, a fan, a kitchen appliance, a cell phone, a pump or a motor. The electronic device 10 includes a printed circuit board 100 and a magnetic sensor integrated circuit 200 provided on the printed circuit board 100 to sense a magnetic field. The electronic device 10 may further includes other components, which is not related to a design point of the disclosure and is not described in detail herein.

Three jacks, which include a power supply jack 101, a ground jack 102 and a signal jack 103, are provided on the printed circuit board 100 to install the magnetic sensor integrated circuit 200. The magnetic sensor integrated circuit 200 includes a shell 220, a semiconductor substrate (not shown in the drawings) installed in the shell 220, and a first to a third port 221, 222 and 223 extending from the shell 220. The power supply jack 101 is connected to an anode of an external direct current power supply via wirings on the printed circuit board 100, the ground jack 102 is connected to an cathode of the external direct current power supply (such as ground) via the wirings on the printed circuit board 100, and the signal jack 103 is connected, via the wirings on the printed circuit board 100, to components in the electronic device 10 which are required for receiving the magnetic field signal, such as a microprocessor or a controllable bidirectional alternating current switch. Preferably but not limited hereto, the power supply jack 101, the ground jack 102 and the signal jack 103 are arranged in a line on the printed circuit board 100, the signal jack 103 is located between the power supply jack 101 and the ground jack 102, and a distance between the signal jack 103 and the power supply jack 101 is the same as a distance between the signal jack 103 and the ground jack 102. The first port 221 to the third port 223 of the magnetic sensor integrated circuit 200 are arranged in a line on the bottom surface of the shell 220, the third port 223 is located between the first port 221 and the second port 222, and a distance between the third port 223 and the first port 221 is the same as a distance between the third port 223 and the second port 222. In the embodiment, the power supply jack 101, the ground jack 102 and the signal jack 103 on the printed circuit board 100 may be respectively provided on a power supply pad, a ground pad and a signal pad.

As can be understood, in another embodiment, the magnetic sensor integrated circuit 200 may has a surface mount package, and correspondingly, no jack is provided on the power supply pad, the ground pad and the signal pad on the printed circuit board 100.

Figure 12:
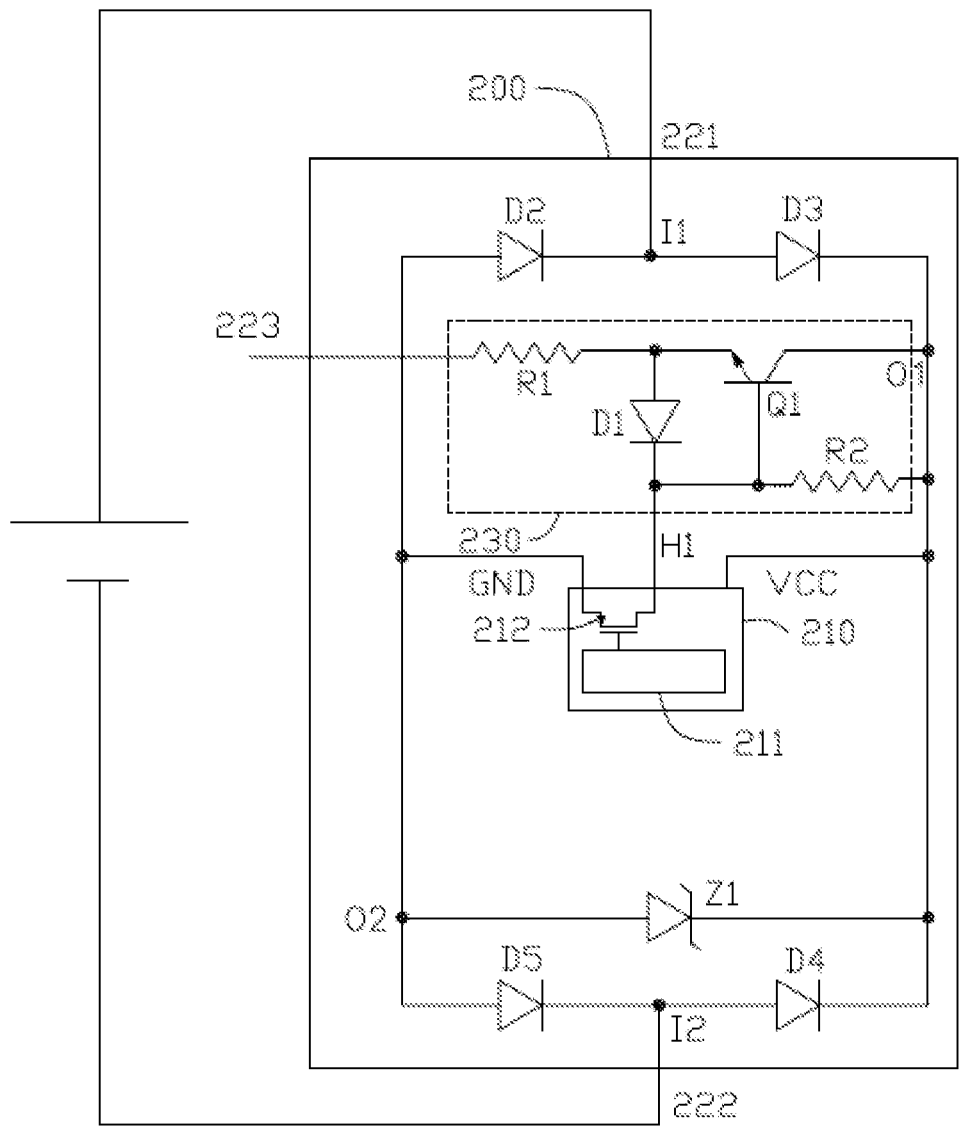
FIG. 12 is a diagram of a magnetic sensor integrated circuit shown in FIG. 11 according to a first embodiment.

Referring to FIG. 12, a rectifier, a position sensor 210 and an output control circuit 230 are provided on the semiconductor substrate.

In the embodiment, the rectifier is a full-bridge rectifier. The rectifier includes four diodes D2 to D5. A cathode of the diode D2 is connected to an anode of the diode D3, a cathode of the diode D3 is connected to a cathode of the diode D4, an anode of the diode D4 is connected to a cathode of the diode D5, and an anode of the diode D5 is connected to an anode of the diode D2. The cathode of the diode D2, as a first input terminal I1 of the rectifier, is connected to a first port 221. The anode of the diode D4, as a second input terminal I2 of the rectifier, is connected to a second port 222. The cathode of the diode D3, as a first output terminal O1 of the rectifier, is connected to the position sensor 210, and the first output terminal O1 outputs a high direct current working voltage. The anode of the diode D5, as a second output terminal O2 of the rectifier, is connected to the position sensor 210, and the second output terminal O2 outputs a low voltage which is lower than the voltage output by the first output terminal. A voltage stabilizer such as a zener diode Z1 is connected between the first output terminal O1 and the second output terminal O2 of the rectifier. The anode of the zener diode Z1 is connected to the second output terminal O2, and the cathode of the zener diode Z1 is connected to the first output terminal O1. In the other embodiments, electronic components such as a three terminal regulator may be used to stabilize the voltage.

Preferably, the position sensor 210 is a Hall sensor. The Hall sensor is a magnetic sensor, which may detect a magnetic field and a change of the magnetic field. The Hall sensor includes a Hall unit 211 and a MOS transistor 212. The Hall unit 211 includes a voltage stabilizer, a Hall sheet and an operational amplifier (not shown in the drawings). The Hall sensor includes a power supply terminal VCC, a ground terminal GND and an output terminal H1. A gate of the MOS transistor 212 is connected to the Hall unit 211, a source of the MOS transistor 212 is connected to the ground terminal GND, and a drain of the MOS transistor 212 is connected to the output terminal H1. The power supply terminal VCC of the position sensor 210 is connected to the first output terminal O1 of the rectifier, and the ground terminal GND of the position sensor 210 is connected to the second output terminal O2 of the rectifier. The voltage provided by the rectifier may be provided to the Hall sheet after being processed by a voltage reduction circuit and voltage stabilizer in the Hall unit 211, or may be directly provided to the Hall sheet. The Hall sheet senses a polarity of an external magnetic field or a change of the external magnetic field. In the embodiment, the polarity of the external magnetic field is north (North), the Hall unit 211 outputs a logic high, the MOS transistor 212 is turned off, and there is no output in the output terminal H1 of the position sensor 210. If south (South) is detected, the Hall unit 211 outputs a logic low, the MOS transistor 212 is turned on, the output terminal H1 of the position sensor 210 outputs a magnetic field signal at a logic low. In the embodiment, the MOS transistor 212 is a positive channel metal oxide semiconductor field effect transistor (P channel MOS transistor). As may be understood, in other embodiments, the MOS transistor 212 may be alternatively other types of semiconductor switches, such as other field effect transistors, e.g., a junction field effect transistor (JFET), or a metal semiconductor field effect transistor.

In another embodiment, if the magnetic field detected by the position sensor 210 is north, the output terminal H1 outputs a magnetic field signal at a logic low, and if the magnetic field detected by the position sensor 210 is south, the output terminal H1 outputs a magnetic field signal at a logic high.

The output control circuit 230 is connected between the output terminal H1 of the position sensor 210 and the third port 223, and a signal output by the output control circuit 230 is determined based on the magnetic field signal output by the output terminal H1 of the position sensor 210. In the embodiment, in a case that there is no output in the output terminal H1 of the position sensor 210, the output control circuit 230 outputs a logic high, and in case that the output terminal H1 of the position sensor 210 outputs a magnetic field signal at a logic low, the output control circuit 230 outputs a logic low.

In the embodiment, the output control circuit 230 includes a first to a third terminal. The first terminal is connected to the first output terminal O1 of the rectifier, the second terminal is connected to the output terminal H1 of the position sensor 210, and the third terminal is connected to the third port 223. The output control circuit 230 includes a resistor R2, a NPN triode Q1, a diode D1 and a resistor R1 which are connected in series between the output terminal H1 of the position sensor 210 and the third port 223. The cathode of the diode D1 serves as the second terminal of the output control circuit 230 and is connected to the output terminal H1 of the position sensor 210. One end of the resistor R2 is connected to the first output terminal O1 of the rectifier, and the other end of the resistor R2 is connected to the output terminal H1 of the position sensor 210. The base of the NPN triode Q1 is connected to the output terminal H1 of the position sensor 210, the emitter of the NPN triode Q1 is connected to the anode of the diode D1, and the collector of the NPN triode Q1 serves as the first terminal and is connected to the first output terminal O1 of the rectifier. The end of the resistor R1 which is not connected to diode D1 serves as the third terminal and is connected to the third port 223.

The principle that the magnetic sensor integrated circuit 200 can work well no matter the magnetic sensor integrated circuit 200 is installed on the printed circuit board 100 positively or negatively is described in detail in conjunction with drawings.

Referring to FIG. 11 and FIG. 12, the magnetic sensor integrated circuit 200 is normally (or positively) installed on the printed circuit board 100. The first port 221 is inserted into the power supply jack 101, the second port 222 is inserted into the ground jack 102, and the third port 223 is inserted into the signal jack 103. A connection relation between the magnetic sensor integrated circuit 200 and the external direct current power supply is shown in FIG. 12, i.e., the first port 221 is connected to the anode of the power supply, and the second port 222 is connected to the cathode of the power supply. In this case, the diode D3 and the diode D5 of the rectifier are turned on, the diode D2 and the diode D4 of the rectifier are turned off, the first output terminal O1 of the rectifier outputs a high voltage to a power supply terminal VCC of the position sensor 210, a ground terminal GND of the position sensor 210 is connected to the cathode of the power supply via the turned-on diode D5 so as to form a current loop, and the position sensor 210 works normally. In a case that the polarity of the external magnetic field is north, the Hall unit 211 outputs a logic high, the MOS transistor 212 is turned off, there is no output in the output terminal H1 of the position sensor 210, the NPN triode Q1 is turned on, and the third port 223 of the magnetic sensor integrated circuit 200 outputs a signal at a logic high. In a case that the polarity of the external magnetic field is south, the Hall unit 211 outputs a logic low, the MOS transistor 212 is turned on, the output terminal H1 of the position sensor 210 outputs a signal at a logic low, and a voltage drop across the third port 223 is equal to a sum of a voltage drop across the diode D5 (e.g., 0.7V) and a voltage drop (preferably, less than 0.5V) between the drain of the turned-on MOS transistor 212 and the source of the turned-on MOS transistor 212, therefore, the voltage drop across the third port 223 is less than 1.2V which can be regarded as a logic low. In conclusion, in a case that the magnetic sensor integrated circuit 200 is normally installed on the printed circuit board 100, the position sensor 210 is powered normally, the power supply terminal VCC of the position sensor 210 receives a high voltage, and the ground terminal GND of the position sensor 210 receives a low voltage. A level of a signal output by the output control circuit 230 is basically consistent with a level of a magnetic field signal sensed by the position sensor 210, and the magnetic sensor integrated circuit 200 operates normally. In the embodiment, the magnetic sensor integrated circuit 200 is installed on the electronic device 10, and there is no need to connect the third port 223 to a pull-up resistor because the third port 223 has been connected to a high voltage output terminal of the rectifier via the NPN triode Q1 and the resistor R2 of the output control circuit 230 in the magnetic sensor integrated circuit 200, such that if the Hall unit 211 outputs a signal at a logic high, the third port 223 correspondingly outputs a signal at a logic high.

Figure 13:
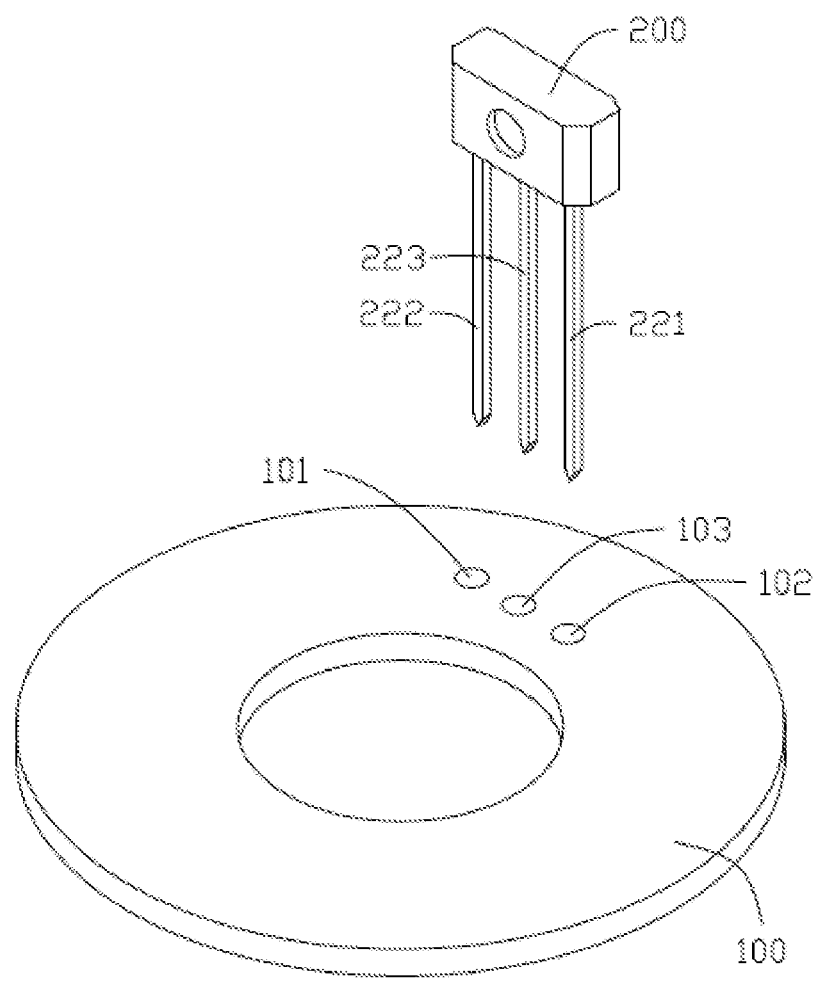
FIG. 13 is a stereogram of a magnetic sensor integrated circuit reversely installed on a printed circuit board.
Figure 14:
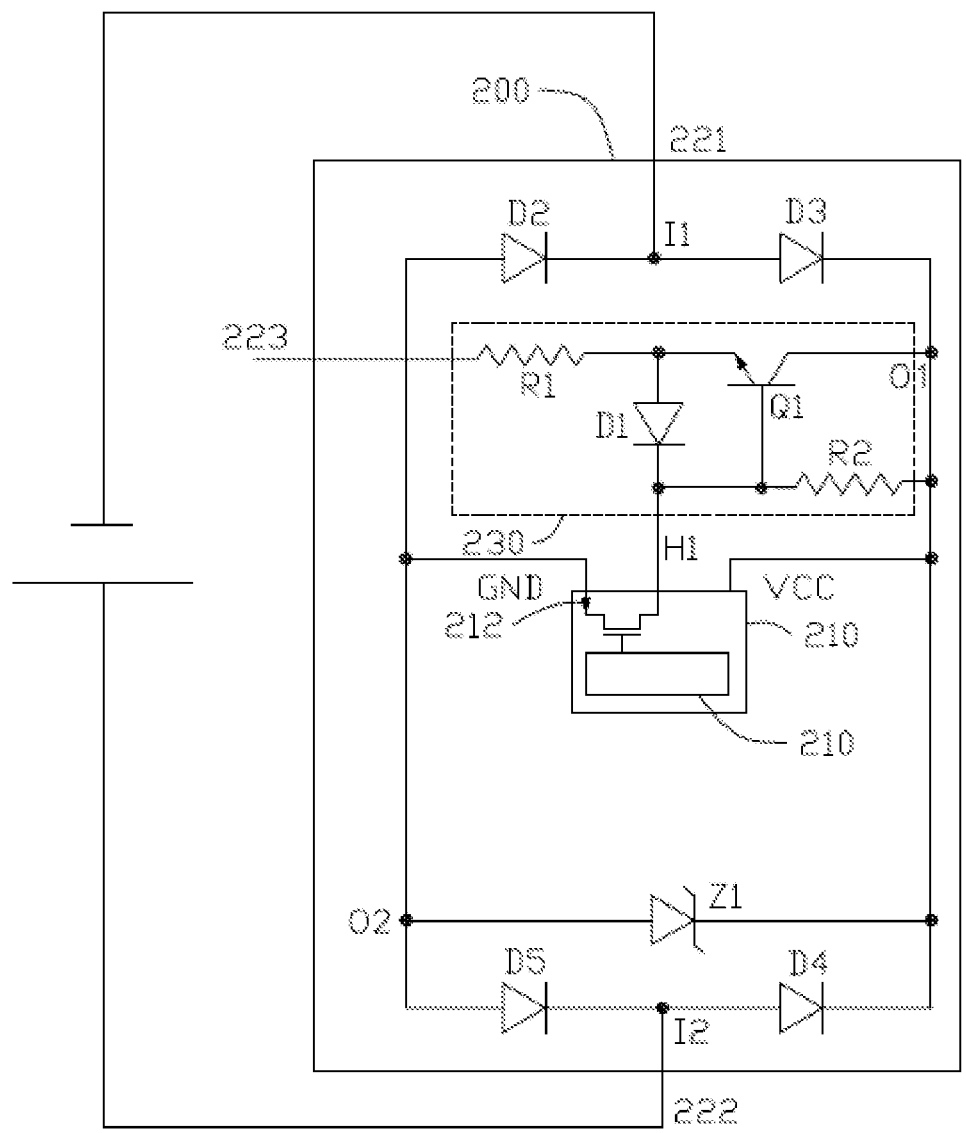
FIG. 14 is a diagram of a magnetic sensor integrated circuit reversely installed on a printed circuit board.

Referring to FIG. 13 and FIG. 14, the magnetic sensor integrated circuit 200 is reversely (or negatively) installed on the printed circuit board 100. The first port 221 is inserted into the ground jack 102, the second port 222 is inserted into the power supply jack 101, and the third port 223 is inserted into the signal jack 103. A connection relation between the magnetic sensor integrated circuit 200 and the external direct current power supply is shown in FIG. 14, i.e., the first port 221 is connected to the cathode of the power supply, and the second port 222 is connected to the anode of the power supply. The diode D2 and the diode D4 are turned on, the diode D3 and the diode D5 are turned off, the first output terminal O1 of the rectifier still outputs a high voltage to the power supply terminal VCC of the position sensor 210, the ground terminal GND of the position sensor 210 is connected to the cathode of the power supply via the turned-on diode D2 so as to form a current loop, and the position sensor 210 works normally. The position sensor 210 detects the magnetic field the same as the case that magnetic sensor integrated circuit 200 is normally installed on the printed circuit board 100, which is not repeated herein.

Figure 15:
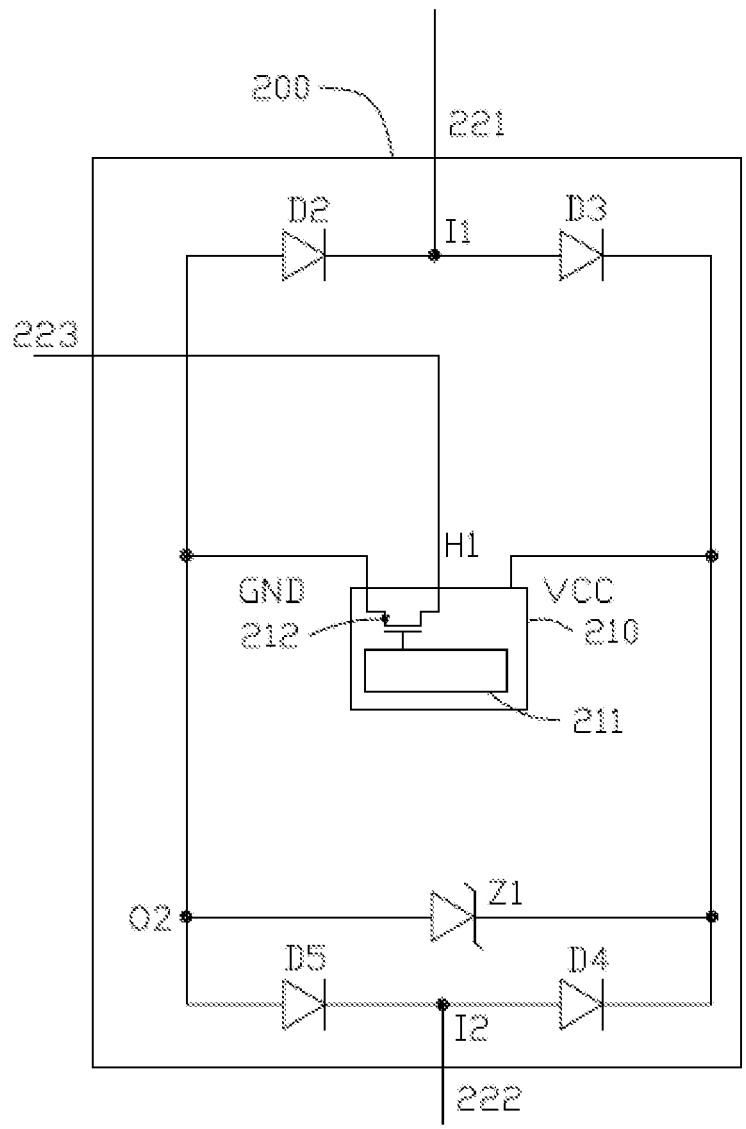
FIG. 15 is a diagram of a magnetic sensor integrated circuit according to a second embodiment.

Referring to FIG. 15, a circuit diagram of the magnetic sensor integrated circuit 200 according to a second embodiment is shown. In the embodiment, the structure of the magnetic sensor integrated circuit 200 is basically the same as that in the first embodiment. The difference lies in that in the second embodiment, there is no output control circuit 230 provided in the magnetic sensor integrated circuit 200, and the output terminal H1 of the position sensor is directly connected to the third port 223 of the magnetic sensor integrated circuit 200. In the embodiment, a pull-up resistor is connected to the third port 223. The pull-up resistor may be provided inside the magnetic sensor integrated circuit 200, or may be alternatively provided outside the magnetic sensor integrated circuit 200.

It should be understood that, the rectifier may be alternatively in other forms. If four diodes in the rectifier shown in FIG. 12 are replaced with zener diodes, or the diode D2 and the diode D3 in the rectifier shown in FIG. 12 are replaced with the first resistor and the second resistor and the diode D4 and the diode D5 are replaced with a first zener diode and a second zener diode, the position sensor can work normally when the magnetic sensor integrated circuit 200 is positively or negatively provided on the printed circuit board. In other embodiments, the first zener diode, the second zener diode and the position sensor are integrated into one integrated circuit, and the first resistor and the second resistor are provided outside the integrated circuit. The integrated circuit includes a first to a fourth port, the cathode of the first zener diode is connected to the first port, the anode of the second zener diode is connected to the second port, the cathode of the first zener diode is connected to the third port, and the magnetic field signal detected by the position sensor is output by the fourth port.

It should be understood that, the magnetic sensor integrated circuit may include a single one bare die, or includes more than one bare die. The rectifier, the output control circuit and the position sensor may be provided on a bare die or on different bare dies.

In the embodiments of the disclosure, in addition to the position sensor 210, at least a rectifier is integrated into the magnetic sensor integrated circuit 200. The rectifier is configured as follows: no matter the magnetic sensor integrated circuit 200 is connected to an external power supply positively or negatively, the power supply terminal VCC of the position sensor 210 always receives a high voltage output by the rectifier, and the ground terminal GND of the position sensor 210 always receives a low voltage output by the rectifier. In that way, even though the magnetic sensor integrated circuit 200 is installed reversely due to carelessness of operating personnel when the device is manufactured, the position sensor 210 works normally. With the magnetic sensor integrated circuit according to embodiments of the disclosure, there is no need to consider whether the magnetic sensor integrated circuit is installed positively or negatively when installed on the printed circuit board, thereby improving the production efficiency.

It should be understood that, the connection in the disclosure includes both a direct connection and an indirect connection, as long as the working principles are not changed.

The above are only preferred embodiments of the present disclosure, and the embodiments are not to limit the disclosure. Any change, equivalent substitution and modification without departing from the spirit and principles of the present disclosure are fall within the protection scope of the disclosure.

The invention claimed is:

1. A magnetic sensor integrated circuit, comprising a shell, a semiconductor substrate installed in the shell, and a first to a third port extending from the shell, wherein the semiconductor substrate is provided with:
  a rectifier directly powered by a direct current power supply and comprising a first output terminal, a second output terminal and two input terminals respectively connected to the first port and the second port, wherein in a case that the first port and the second port are positively or negatively connected to the direct current power supply, a voltage output by the first output terminal of the rectifier is higher than the voltage output by the second output terminal of the rectifier; and
  a position sensor configured to detect a magnetic field, wherein the position sensor is connected to the first output terminal and the second output terminal of the rectifier, and a magnetic field signal detected by the position sensor is output via the third port; and
  an output control circuit comprising a first resistor, a NPN triode, a second resistor and a diode, the second resistor and the diode are connected in series between the output terminal of the position sensor and the third port, a cathode of the diode is connected to the output terminal of the position sensor, one end of the first resistor is connected to the first output terminal of the rectifier, and another end is connected to the output terminal of the position sensor, a base of the NPN triode is connected to the output terminal of the position sensor, an emitter of the NPN triode is connected to an anode of the diode, and a collector of the NPN triode is connected to the first output terminal of the rectifier.

2. The magnetic sensor integrated circuit according to claim 1, wherein the position sensor comprises a power supply terminal, a ground terminal and an output terminal, the power supply terminal is connected to the first output terminal of the rectifier, the ground terminal is connected to the second output terminal of the rectifier, and the output terminal of the position sensor is connected to the third port.

3. The magnetic sensor integrated circuit according to claim 1, wherein output control circuit comprises a first to a third terminal, the first terminal is connected to the first output terminal of the rectifier, the second terminal is connected to an output terminal of the position sensor, the third terminal is connected to the third port, and a signal output by the third terminal of the output control circuit is determined based on a magnetic field signal output by the output terminal of the position sensor.

4. The magnetic sensor integrated circuit according to claim 3, wherein in a case that the magnetic field signal output by the output terminal of the position sensor is a logic high, the third terminal of the output control circuit outputs a logic high; and in a case that the magnetic field signal output by the output terminal of the position sensor is a logic low, the third terminal of the output control circuit outputs a logic low.

5. The magnetic sensor integrated circuit according to claim 1, wherein the magnetic sensor integrated circuit comprises a single one bare die, or comprises more than one bare die.

6. The magnetic sensor integrated circuit according to claim 1, wherein the third port is located between the first port and the second port.

7. The magnetic sensor integrated circuit according to claim 6, wherein a distance between the third port and the first port is the same as a distance between the third port and the second port.

8. The magnetic sensor integrated circuit according to claim 1, wherein the position sensor is a Hall sensor.

9. The magnetic sensor integrated circuit according to claim 1, wherein a voltage stabilizer is provided between the first output terminal and the second output terminal of the rectifier.

10. A magnetic sensor integrated circuit, comprising a shell, a semiconductor substrate installed in the shell, and a first to a third port extending from the shell, wherein the semiconductor substrate is provided with:
  a rectifier comprising a first output terminal, a second output terminal and two input terminals respectively connected to the first port and the second port, wherein in a case that the first port and the second port are positively or negatively connected to an external power supply, a voltage output by the first output terminal of the rectifier is higher than the voltage output by the second output terminal of the rectifier; and a position sensor configured to detect a magnetic field, wherein the position sensor is connected to the first output terminal and the second output terminal of the rectifier, and a magnetic field signal detected by the position sensor is output via the third port; and an output control circuit comprising a first resistor, a NPN triode, a second resistor and a diode, the second resistor and the diode are connected in series between an output terminal of the position sensor and the third port, a cathode of the diode is connected to the output terminal of the position sensor, one end of the first resistor is connected to the first output terminal of the rectifier, and another end is connected to the output terminal of the position sensor, a base of the NPN triode is connected to the output terminal of the position sensor, an emitter of the NPN triode is connected to an anode of the diode, and a collector of the NPN triode is connected to the first output terminal of the rectifier.

* * * * *